US012132127B2

(12) United States Patent
Forrest et al.

(10) Patent No.: US 12,132,127 B2
(45) Date of Patent: Oct. 29, 2024

(54) INTEGRATED SOLAR COLLECTORS USING EPITAXIAL LIFT OFF AND COLD WELD BONDED SEMICONDUCTOR SOLAR CELLS

(71) Applicant: The Regents of the University of Michigan, Ann Arbor, MI (US)

(72) Inventors: Stephen R. Forrest, Ann Arbor, MI (US); Christopher Kyle Renshaw, Chicago, IL (US); Michael Slootsky, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 17/484,342

(22) Filed: Sep. 24, 2021

(65) Prior Publication Data
US 2022/0013672 A1    Jan. 13, 2022

Related U.S. Application Data

(63) Continuation of application No. 14/853,317, filed on Sep. 14, 2015, now abandoned, which is a
(Continued)

(51) Int. Cl.
*H01L 31/0232*    (2014.01)
*H01L 31/0304*    (2006.01)
(Continued)

(52) U.S. Cl.
CPC .. *H01L 31/02327* (2013.01); *H01L 31/03046* (2013.01); *H01L 31/0392* (2013.01);
(Continued)

(58) Field of Classification Search
CPC ........... H01L 31/02327; H01L 31/0445; H02S 40/20
See application file for complete search history.

(56) References Cited

U.S. PATENT DOCUMENTS

| 5,288,337 A | 2/1994 | Mitchell |
| 5,324,365 A | 6/1994 | Niwa |

(Continued)

FOREIGN PATENT DOCUMENTS

| CN | 2613726 Y | * | 4/2004 |
| CN | 102082195 A | | 6/2011 |

(Continued)

OTHER PUBLICATIONS

EPO machine translation of CN2613726Y (Year: 2004).*
(Continued)

*Primary Examiner* — Kourtney R S Carlson
(74) *Attorney, Agent, or Firm* — Lempia Summerfield Katz LLC

(57) ABSTRACT

There is disclosed ultrahigh-efficiency single- and multi-junction thin-film solar cells. This disclosure is also directed to a substrate-damage-free epitaxial lift-off ("ELO") process that employs adhesive-free, reliable and lightweight cold-weld bonding to a substrate, such as bonding to plastic or metal foils shaped into compound parabolic metal foil concentrators. By combining low-cost solar cell production and ultrahigh-efficiency of solar intensity-concentrated thin-film solar cells on foil substrates shaped into an integrated collector, as described herein, both lower cost of the module as well as significant cost reductions in the infrastructure is achieved.

19 Claims, 5 Drawing Sheets

Figure 1:
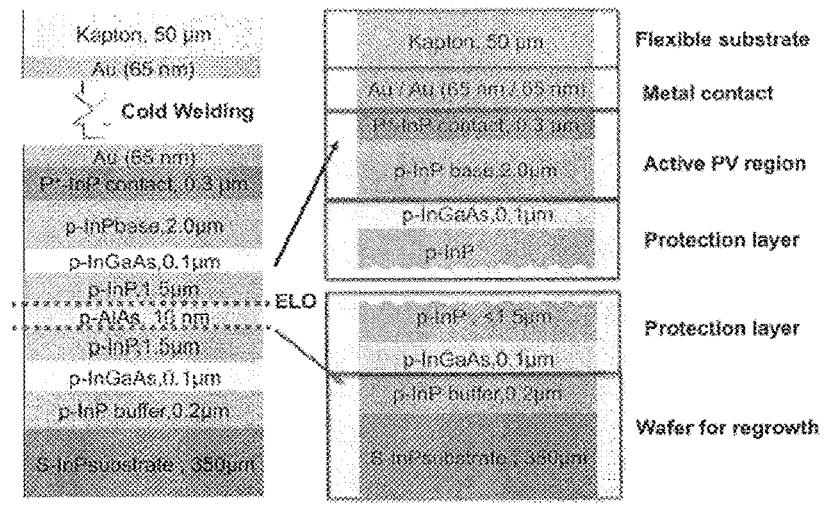

Related U.S. Application Data continuation of application No. 13/543,450, filed on Jul. 6, 2012, now abandoned.

(60) Provisional application No. 61/505,014, filed on Jul. 6, 2011.

(51) Int. Cl.
  *H01L 31/0392* (2006.01)
  *H01L 31/0445* (2014.01)
  *H01L 31/0687* (2012.01)
  *H01L 31/0693* (2012.01)
  *H01L 31/18* (2006.01)

(52) U.S. Cl.
  CPC .... *H01L 31/03926* (2013.01); *H01L 31/0445* (2014.12); *H01L 31/0687* (2013.01); *H01L 31/0693* (2013.01); *H01L 31/1844* (2013.01); *H01L 31/1896* (2013.01); *Y02E 10/52* (2013.01); *Y02E 10/544* (2013.01)

(56) References Cited

U.S. PATENT DOCUMENTS

| | | | |
|---|---|---|---|
| 5,939,733 A | 8/1999 | Sato | |
| 9,412,960 B2 | 8/2016 | Forrest et al. | |
| 2001/0011551 A1* | 8/2001 | Peumans | H01L 31/0547 136/246 |
| 2006/0086383 A1* | 4/2006 | Ruelle | H01L 31/0547 136/246 |
| 2007/0193620 A1* | 8/2007 | Hines | F24S 23/00 136/246 |
| 2009/0038678 A1 | 2/2009 | Pan et al. | |
| 2009/0044860 A1 | 2/2009 | Pan et al. | |
| 2009/0235985 A1 | 9/2009 | Lubart et al. | |
| 2010/0047959 A1 | 2/2010 | Cornfeld et al. | |
| 2011/0094564 A1* | 4/2011 | McCall | F24S 23/71 136/246 |
| 2011/0108081 A1 | 5/2011 | Werthen et al. | |
| 2012/0011850 A1 | 1/2012 | Hebrink et al. | |

FOREIGN PATENT DOCUMENTS

| | | |
|---|---|---|
| JP | 2010120088 A | 6/2010 |
| TW | 200946775 A | 11/2009 |
| TW | 201034223 A | 9/2010 |
| WO | 2010026415 A2 | 3/2010 |
| WO | 2011066029 A2 | 6/2011 |

OTHER PUBLICATIONS

Chemisana et al: "Building Integrated Concentrating Photovoltaics: A review", Renewable and Sustainable Energy Reviews, vol. 15, No. 1, Jan. 1, 2011, pp. 603-611, XP027480790.

D.S. Ghosh, L. Martinez, and V. Pruneri, "Transparent Metal Electrodes," in CLEO/Europe and EQEC 2009 Conference Digest, (Optical Society of America, 2009), paper CE_p. 6. (Year: 2009).

International Search Report from corresponding PCT Application No. PCT/US2012/045778, dated Mar. 28, 2013.

Kyusang Lee et al: "Epitaxial Lift-off of GaAs Thin-film Solar Cells Followed by Substrate Reuse", Photovoltaic Specialists Conference (PVSC), 2012 38th IEEE, IEEE, Jun. 3, 2012-Jun. 8, 2012, pp. 1698-1700, XP032258140.

Lee Kyusang et al: "Multiple Growths of Epitaxial Lift-off Solar Cells From A Single InP Substrate", Applied Physics Letters, vol. 97, No. 10, Sep. 8, 2010, pp. 101107-101107 (3 pgs), XP012136787.

Lee Kyusang et al: "Reuse of GaAs Substrates for Epitaxial Lift-off By Employing Protection Layers", Journal of Applied Physics, American Institute of Physics, vol. 111, No. 3, Feb. 1, 2012, pp. 33527-33527 (6 pgs.), XP012158092.

Van Geelen A. et al: "Epitaxial Lift-off GaAs Solar Cell From A Reusable GaAs Substrate", Materials Science and Engineering B, vol. 45. No. 1-3, Mar. 1, 1997, pp. 162-171, XP004083654.

Van Niftrik A.T.J et al: "The Influence of InxGa1-xAs and GaAs1-yPy Layers Surrounding the AlAs Release Layer in the Epitaxial Lift-Off Process", Crystal Growth and Design, vol. 7, No. 12, Nov. 17, 2007, pp. 2472-2480. XP009168123.

* cited by examiner

INTEGRATED SOLAR COLLECTORS USING EPITAXIAL LIFT OFF AND COLD WELD BONDED SEMICONDUCTOR SOLAR CELLS

CROSS-REFERENCE TO RELATED APPLICATION

This application is a continuation of application Ser. No. 14/853,317, filed Sep. 14, 2015, which, in turn, was a continuation of application Ser. No. 13/543,450, filed Jul. 6, 2012, which, in turn, claimed the benefit of U.S. Provisional Application No. 61/505,014, filed Jul. 6, 2011, which is incorporated herein by reference in its entirety.

JOINT RESEARCH AGREEMENT

The claimed invention was made by, on behalf of, and/or in connection with one or more of the following parties to a joint university-corporation research agreement: University of Michigan and Global Photonic Energy Corporation. The agreement was in effect on and before the date the invention was made, and the claimed invention was made as a result of activities undertaken within the scope of the agreement.

This disclosure is directed to a ultrahigh-efficiency single- and multi-junction thin-film solar cells. This disclosure is also directed to a substrate-damage-free epitaxial lift-off ("ELO") process that employs adhesive-free, reliable and lightweight cold-weld bonding to a substrate, such as bonding to plastic or metal foils shaped into compound parabolic metal foil concentrators.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material.

The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m2, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max}V_{max}\}/\{I_{SC}V_{OC}\} \tag{1}$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\gamma_P$, may be calculated by:

$$\gamma_P = ff \cdot (I_{SC} \cdot V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu\Psi S_0^*$. Here $S_0$ and $S_0^*$ denote ground and excited molecular states, respectively. This energy absorption is associated with the promotion of an electron from a bound state in the HOMO energy level, which may be a B-bond, to the LUMO energy level, which may be a B*-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to %. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cell, such as reported by Tang, *Appl. Phys Lett.* 48, 183

(1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency γ associated with each of these processes. Subscripts may be used as follows: P for power efficiency, EXT for external quantum efficiency, A for photon absorption, ED for diffusion, CC for collection, and INT for internal quantum efficiency. Using this notation:

$$\gamma_P \sim \gamma_{EXT} = \gamma_A * \gamma_{ED} * \gamma_{CC}$$

$$\gamma_{EXT} = \gamma_A * \gamma_{INT}$$

The diffusion length ($L_D$) of an exciton is typically much less ($L_D \sim 50\text{Å}$) than the optical absorption length (~500Å), requiring a trade-off between using a thick, and therefore resistive, cell with multiple or highly folded interfaces, or a thin cell with a low optical absorption efficiency.

The falloff in intensity of an incident flux of electromagnetic radiation through a homogenous absorbing medium is generally given by $I = I_o e^{-\alpha x}$ where $I_0$ is the intensity at an initial position (X=0), α is the absorption constant and x is the depth from x=0. Thus, the intensity decreases exponentially as the flux progresses through the medium. Accordingly, more light is absorbed with a greater thickness of absorbent media or if the absorption constant can be increased. Generally, the absorption constant for a given photoconductive medium is not adjustable. For certain photoconductive materials, e.g., 3,4,9,10 perylenetetracarboxylic-bis-benzimidazole (PTCBI), or copper phthalocyanine (CuPc), very thick layers are undesirable due to high bulk resistivities.

By suitably re-reflecting or recycling light several times through a given thin film of photoconductive material the optical path through a given photoconductive material can be substantially increased without incurring substantial additional bulk resistance. A solution is needed, which efficiently permits electromagnetic flux to be collected and delivered to the cavity containing the photoconductive material while also confining the delivered flux to the cavity so that it can absorbed.

Less expensive and more efficient devices for photogeneration of power have been sought to make solar power competitive with presently cheaper fossil fuels. Organic photoconductors, such as CuPc and PTCBI, have been sought as materials for organic photovoltaic devices (OPVs) due to potential cost savings. The high bulk resistivities noted above make it desirable to utilize relatively thin films of these materials. However, the use of very thin organic photosensitive layers presents other obstacles to production of an efficient device. As explained above, very thin photosensitive layers absorb a small fraction of incident radiation thus keeping down external quantum efficiency.

Another problem is that very thin films are more subject to defects such as shorts from incursion of the electrode material. U.S. Pat. No. 6,333,458, incorporated herein by reference, describes photosensitive heterostructures incorporating one or more exciton blocking layers which address some of the problems with very thin film OPVs. However, other solutions are needed to address the problem of low photoabsorption by very thin films, whether the films are organic or inorganic photoconductors.

The use of optical concentrators, as known as Winston collectors is common in the field of solar energy conversion. Such concentrators have been used primarily in thermal solar collection devices wherein a high thermal gradient is desired. To a lesser extent, they have been used with photovoltaic solar conversion devices. However, it is thought that such applications have been directed to devices wherein photoabsorption was expected to occur upon initial incidence of light upon the active photoconductive medium. If very thin photoconductor layers are used, it is likely that much of the concentrated radiation will not be absorbed. It may be reflected back into the device environment, absorbed by the substrate or merely pass through if the substrate is transparent. Thus, the use of concentrators alone does not address the problem of low photoabsorption by thin photoconductive layers. Optical concentrators for radiation detection have also been used for the detection of Cerenkov or other radiation with photomultiplier ("PM") tubes. PM tubes operate on an entirely different principle, i.e., the photoelectric effect, from solid state detectors such as the OPVs of the present invention. In a PM tube, low photoabsorption in the photoabsorbing medium, i.e., a metallic electrode, is not a concern, but PM tubes require high operating voltages unlike the OPVs disclosed herein.

Light focusing and trapping is an important avenue to increasing the performance of thin film photovoltaic solar cells and photodetectors. However, the mirrors typically used in such schemes utilize metals, such as silver or gold, which can result in significant loss of incident photons due to spectral absorption of the mirror. Thus, it would be advantageous to provide a structure to increase the light-trapping in a thin film photovoltaic solar cell or photodetector with reduced losses across a large spectral range.

The Inventors have recently demonstrated that growth via molecular beam epitaxy (MBE) of thin, high-efficiency III-V semiconductor solar cells that were "lifted off" from the costly, parent substrate following epitaxial growth. Such a process is significantly different from conventional ELO technologies employed over the last two decades in that "protection layers" were grown surrounding the "sacrificial ELO layer" that is typically etched away to part the active device epitaxy (—2 μm thick) from the parent substrate. This process is described in U.S. patent application Ser. No. 13/099,850, which is herein incorporated by reference in its entirety. By using a composite protection layer structure both chemical and surface morphological degradation of the parent wafer are eliminated as shown in FIG. 1.

Accordingly, the surface of the processed wafer can be made smoother than the starting wafer, and its surface chemistry also remains unchanged, hence removing the need for wafer re-polishing prior to reuse for growth of additional, and also ultimately removable, epitaxial layers. Thus, the parent wafer can be reused indefinitely, as none of the original parent wafer is consumed or altered during the process. Indeed, only the epitaxial active layers that comprise the thin-film, single-crystal, high-efficiency solar cell active region are removed from the entire wafer surface, and subsequently cold-welded (without adhesives that add cost, weight and potential for failure) to a second, thin-film "host" substrate.

Since the substrate is the most costly material used in the process, the multiple-reuse strategy removes the wafer as a material's cost, and transforms its acquisition into a capital expense, fundamentally changing the cost structure of single crystal Ill-V-based solar cells. If the very thin, active epitaxial layers of the solar cell are also bonded to a metal or metalized plastic foil without using adhesives, the cost, weight and form factor of the resulting module is also favorably impacted.

In an effort to address at least some of the foregoing described needs, there is disclosed an ultrahigh-efficiency single- and multi-junction thin-film solar cell. The present disclosure is also directed to a substrate-damage-free epitaxial lift-off ("ELO") process that employs adhesive-free, reliable and lightweight cold-weld bonding to a substrate, such as bonding to plastic or metal foils shaped into compound parabolic metal foil concentrators. The Inventors have discovered that combining low-cost solar cell production and ultrahigh-efficiency of solar intensity-concentrated thin-film solar cells on foil substrates shaped into an integrated collector, can result not only in lower cost of the module itself, but also in significant cost reductions in the infrastructure by replacing heavy modules with ultra-lightweight cells on foils (including low-cost integrated concentrators), with power densities exceeding 6 W/gm.

In one embodiment, the present disclosure is directed to a thin-film solar cell comprising a first substrate; a metal contact bonded to said first substrate; an active photovoltaic region bonded to said metal contact; one or more first protection layers; an AlAs layer; one or more second protection layers; and a second substrate, wherein said second substrate.

In another embodiment, the present disclosure is directed to a thin-film solar cell comprising a first substrate; a metal contact bonded to said first substrate; an active photovoltaic region bonded to said metal contact; one or more first protection layers, wherein at least one of said first protection layers comprise at least one compound chosen from InGaP, GaAs, InGaAs, InP, and InAlP; an AlAs layer; one or more second protection layers, wherein at least one of said second protection layers comprise at least one compound chosen from InGaP, GaAs, InGaAs, InP, and InAlP; and a second substrate, wherein said second substrate comprises at least one compound chosen from GaAs and InP.

In a further embodiment, the present disclosure is directed to a method for performing an epitaxial lift-off process, comprising growing one or more first protection layers on a first substrate; growing an AlAs layer; growing one or more second protection layers; depositing at least one active photovoltaic cell layers on top of the second protection layer; coating the top active photovoltaic cell layer with a metal; coating a second substrate with a metal; pressing together the two metal surfaces to form a cold-weld bond; and removing the AlAs layer with a selective chemical etchant.

In another embodiment, the present disclosure is directed to a method for performing an epitaxial lift-off process, comprising growing one or more first protection layers on a first substrate, wherein at least one of said protection layers comprise a compound chosen from InGaP, GaAs, InGaAs, InP, and InAlP; growing an AlAs layer; growing one or more second protection layers, wherein at least one of said protection layers comprise a compound chosen from InGaP, GaAs, InGaAs, InP, and InAlP; depositing at least one active photovoltaic cell layers on top of the second protection layer; coating the top active photovoltaic cell layer with a metal; coating a second substrate with a metal; pressing together the two metal surfaces to form a cold-weld bond; and removing the AlAs layer with a selective chemical etchant.

Aside from the subject matter discussed above, the present disclosure includes a number of other exemplary features such as those explained hereinafter. It is to be understood that both the foregoing description and the following description are exemplary only.

The accompanying figures are incorporated in, and constitute a part of, this specification.

FIG. 1. Is a schematic showing the ELO process according to the present disclosure for InP based solar cells.

Figure 2:
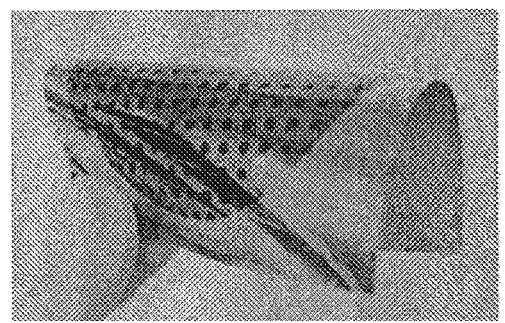

FIG. 2. Is a photograph of a two inch InP epitaxial layer lifted off and bonded to a Au-coated Kaption sheet. ITO contacts form the Schotty solar cells.

Figure 3:
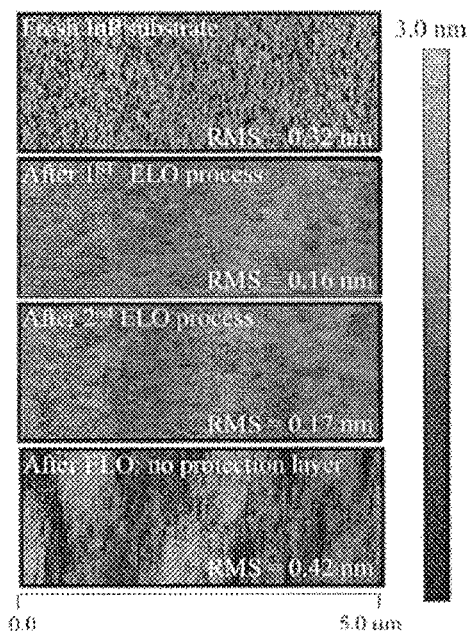

FIG. 3. Is an atomic force microscope image of the original epi-ready InP substrate and recovered surfaces after the first and second ELO processes, with and without the use of protection layers.

Figure 4:
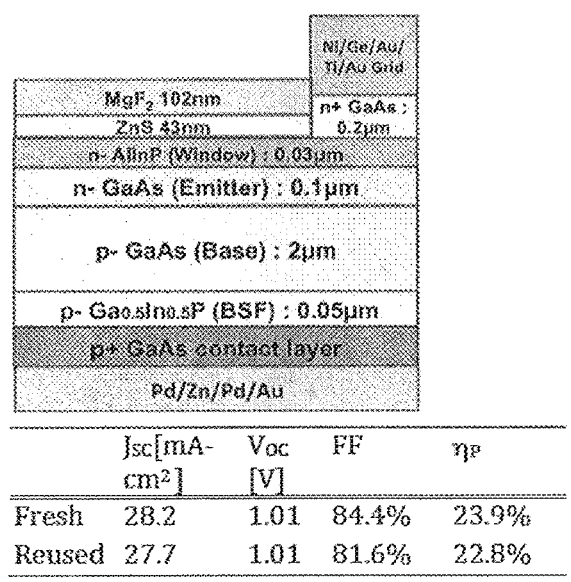

FIG. 4. Is test data and a representative GaAs PV cell layer structure showing cell parameters.

Figure 5:
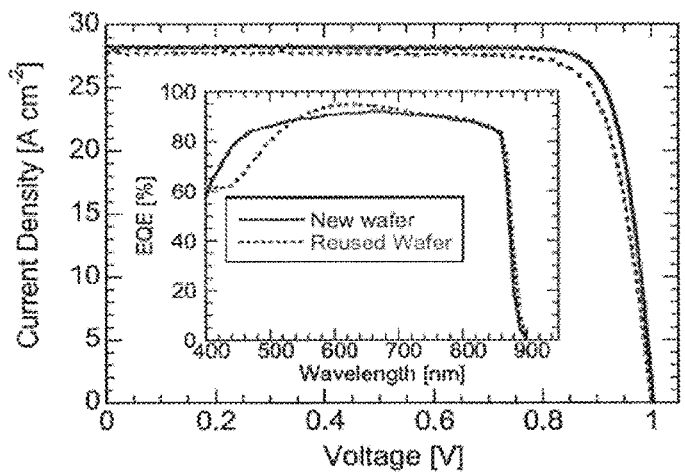

FIG. 5. Is test data showing fourth quadrant current voltage and external quantum efficiency (inset) of a 23.9% efficient first-growth cell and a 22.8% efficient cell grown on a reused wafer.

Figure 6:
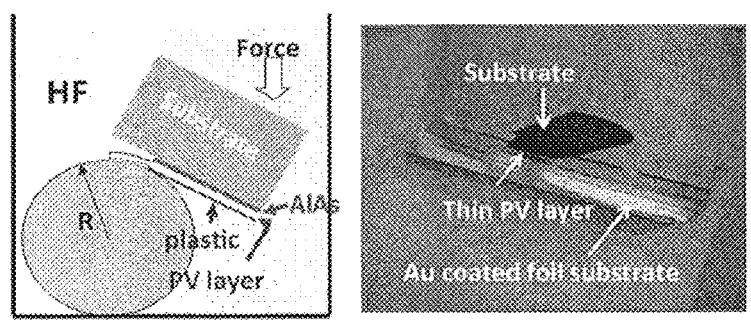

FIG. 6. Is a schematic showing the ELO process as applied to an InP material according to the present disclosure.

Figure 7:
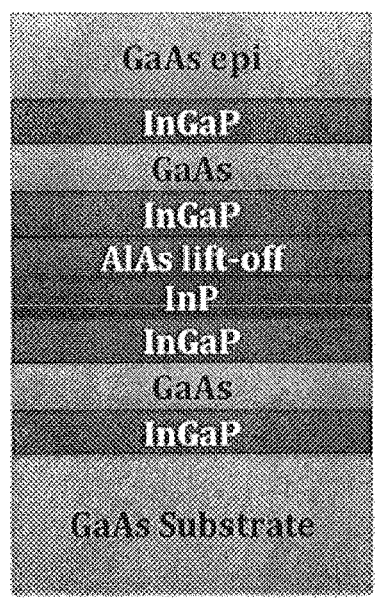

FIG. 7. Is a schematic of a trilayer protection scheme with AlAs layer and AlAs lift-off layer.

Figure 8:
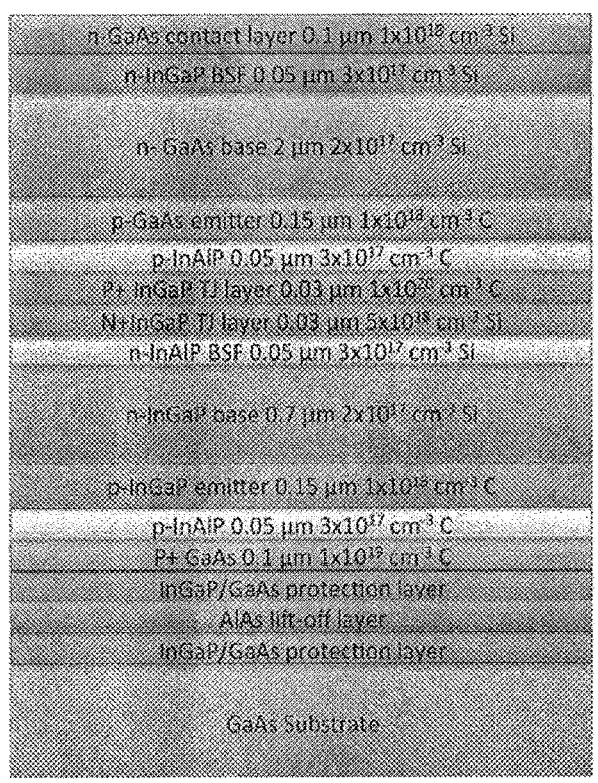

FIG. 8. Is a schematic of a proposed multi-junction cell structure according to the present disclosure.

Figure 9:
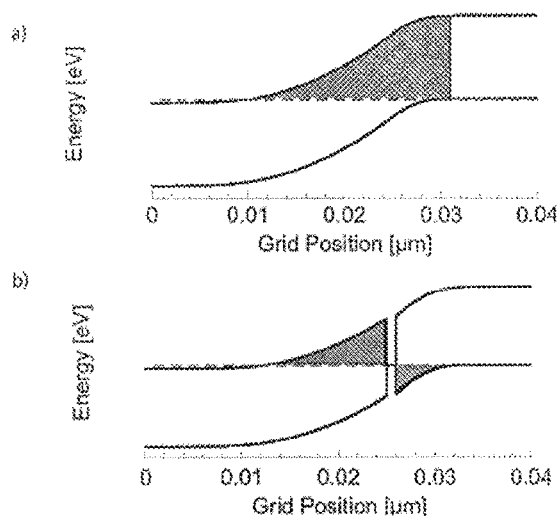

FIG. 9. Is a schematic of (a) conventional N/P tunnel junctions, and (b) N/ErP/P junction showing the reduced tunneling barriers.

Figure 10:
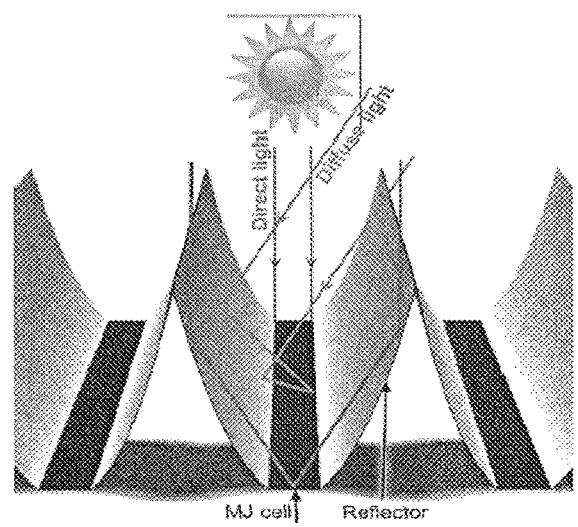

FIG. 10. Is a schematic of an integrated reflector with cold-welded bonded ELO multi-junction cell.

One embodiment of the ELO process is shown schematically in FIG. 1. It begins with the epitaxial growth of the chemically distinct, thin "protection layers" consisting of InGaAs and InP, a sacrificial layer of AlAs, a second set of protection layers of InP and InGaAs, and finally the active photovoltaic cell layers. Next, the top epitaxial layer is coated with Au, as is a very thin plastic (e.g. Kapton™, a polyimide film marked by DuPont) host substrate. By pressing the two clean Au surfaces together at only a few kPa pressure, they form an electronically continuous and permanent, adhesive-free cold-weld bond whose properties are indistinguishable from a single, bulk Au film.

Once bonded to the plastic handle, the wafer is ready for ELO. The cold-weld bond is used not only for the ELO process (the epi-layer is attached permanently to the foil substrate prior to the liftoff, peeling away the parent substrate for eventual reuse) but also as the adhesive to the new host substrate on which the solar cells are eventually fabricated.

Replacement of adhesives conventionally used in lift-off by the cold-weld has several benefits: (i) attachment to the foil substrate is simple and is an integral part of the fabrication sequence, (ii) it is lightweight as it completely eliminates an adhesive layer, (iii) it is thermally and electrical "transparent" since the cold-weld interface is indistinguishable from the bulk of the film, and (iv) it is robust and resistant to failure. A selective chemical etchant, such as $HF:H_2O$, 1:10, is used to remove the 4 nm to 10 nm-thick AlAs sacrificial ELO layer, parting the entire wafer from the photovoltaic epitaxial layers, leaving the protection layers exposed. The purpose of the protection layer nearest the AlAs ELO layer (InP in this case) is to provide an etch selectivity>108:1 and is removed from both the substrate and the parted epitaxial layers with a second wet etch ($HCl:H_3PO_4$, 3:1) that stops at the InGaAs protection layer surface. The requirements of the second protection layer are that it can be removed with a wet etchant that stops abruptly at the InP substrate. The InGaAs layer is removed from the wafer using $H_2SO_4:H_2O_2:H_2O$ (1:1:10), followed by $C_6H_8O_7:H_2O_2$ (20:1), both of which have high selectivity to the InP substrate, InP buffer, and epitaxial layers, and assist in the removal of any debris or asperities remaining after the previous etch. Solar cells are fabricated on the epitaxial layers that are attached to the Kapton™ handle by sputtering indium tin oxide (ITO) Schottky contacts. The resulting flexible InP-ITO Schottky solar cells with efficiencies of ~15% under 1 sun AM1.5G illumination are shown in FIG. 2. These bonded epitaxial sheets have been repeatedly cycled to >200° C. without delamination.

Previous to subsequent growth, the substrate is solvent cleaned, an intentional oxide is grown via exposure to UV/Ozone, and then returned to the growth chamber. The process has been employed multiple times with a single substrate to demonstrate degradation-free reuse of InP wafers, and as shown in FIG. 3, the smoothness of the surface can be improved over that of the commercial epi-ready wafers that are initially used, in principle allowing for indefinite reuse.

The Inventors have recently extended this damage-free regrowth process to GaAs-based single p-n junction photovoltaic cells fabricated on a parent wafer, resulting in efficiencies of 23.9%. FIG. 4 is a schematic representation of such a cell. The lift-off process is similar to that used for the InP cells, although the two-protection-layer scheme used for InP is replaced by a three-layer (InGaP/GaAs/InGaP), fully lattice-matched (to the AlAs sacrificial layer) system. This allows for improved etch-selectivity between layers while eliminating debris or surface roughening incurred in the ELO process. The AlAs layer is removed in HF, followed by removal of the InGaP and GaAs protection layers with $HCl:H_3PO_4$ (1:1) and $H_3PO_4:H_2O_2:H_2O$ (3:1:25), respectively.

Following this process, a second cell is grown on the parent wafer, reaching an efficiency of 22.8%. The slight (1%) reduction in power conversion efficiency between the first and second growths is due to the choice of the dry mesa-isolation etch recipe, resulting in a slight reduction in fill factor (see FIG. 4). Furthermore, the anti-reflection coating thickness was not optimal, reducing the external quantum efficiency and short circuit current as shown in FIG. 5. However, even higher efficiencies, for example greater than 25%, are expected when the coating thickness is optimized.

In one embodiment, a protection layer scheme based on the fully lattice-matched InGaP/GaAs/InGaP trilayer can be used. This tri-layer affords etch chemistries with sufficient rate selectivity between layers required to reproducibly remove the protection layers and to expose a pristine (physically and chemically undamaged) surface. In one embodiment, regrown thin-film cells are bonded via cold-welding to Au-coated plastic (Kapton™) substrates. It has been shown that a PCE=23.9% for a first growth wafer, and PCE=22.8% for a reused wafer can be achieved, which exceeds the Next Generation Photovoltaics II metric of 20% (see FIG. 5). A depiction of the actual ELO process apparatus and method are shown in FIG. 6.

Following each reuse, both the parent wafer and the lifted off epitaxial layers can be thoroughly studied for damage or subtle degradation. These methods include x-ray photoelectron spectroscopy (XPS) to determine chemical changes to the growth and regrowth surfaces, atomic force microscopy, scanning electron microscopy, and surface profilometry to determine surface morphological changes, cross-sectional transmission electron microscopy to examine defects that are incurred within the bulk of the epitaxy, and compositional depth profiling using secondary ion mass spectroscopy (SIMS).

Completed cells, including anti-reflection coating, can also be electrically tested using standard illumination conditions (1 sun, AM1.5G spectrum). Parameters to be measured include PCE, fill factor (FF), open circuit voltage (Voc), short circuit current (Jsc), series and parallel resistance.

It has been found that extended exposure (>2 days) of Ga-containing compounds (i.e. GaAs, and to a lesser degree InGaP) to HF results in surface contamination that is difficult to remove. This reaction, however, is absent for InP surfaces exposed to HF for over 7 days. In one embodiment a thin layer of strained InP placed immediately below the AlAs sacrificial layer will improve the fidelity of the surface, as shown in FIG. 7.

The thickness of the InP is limited to prevent strain relaxation, which can degrade the subsequently grown PV layer quality. The critical thickness of InP on GaAs is between 5 and 6 monolayers, corresponding to ~1.7 nm. In this case the protection layer scheme would comprise InGaP/GaAs/InP or InGaP/GaAs/InGaP/InP, where the additional InGaP layer in the latter structure provides improved protection above the GaAs.

In another embodiment, the etch selectivity and preservation of the as-purchased wafer quality is carried out by using additional materials combinations, for example by replacing the InGaP layer adjacent to the InAlP. An InAlP/InGaP/GaAs/InAlP structure may be advantageous since InAlP can be etched with $HCl:H_2O$ (1:5), which stops abruptly at GaAs (>400:1 etch ratio), whereas $HCl:H_3PO_4$ (1:1) used to etch InGaP slowly attacks the GaAs which results in roughening. By placing the InAlP adjacent to the AlAs layer, the InAlP is attacked by the HF and reduces the buildup of arsenic oxide which can slow the liftoff process. Also, InGaP may be used as an etch stop for the GaAs etch ($H_3PO_4:H_2O_2:H_2O$, 3:1:25) to ensure that the lower InAlP layer is only removed in the final etch step.

Additional cost reduction may be possible by bonding to metal-foil substrates such as Au-coated Cu foils, use of less expensive metals for cold-welding (e.g. Ag instead of Au), reduced consumption of HF, reduced protection layer thicknesses, and accelerating the lift-off process. The extended exposure to HF used to dissolve the AlAs sacrificial layer limits the choice of metal host substrates that can be employed. In one embodiment, Cu foils, which can be used for cold-welding, are used to increase resistance upon exposure to HF, as their use may be simpler than coating the foil with a noble metal such as Au. An additional benefit to using Cu foil is its high thermal conductivity (~4 W cm$^{-1*}$C$^{-1}$) that can be exploited to extract heat from the concentrated cells.

There is also disclosed very high-efficiency multi-junction (GaAs/InGaP) solar cells following the two cell example structure shown in FIG. 8.

The design is inverted relative to a conventional multi-junction cell growth sequence to accommodate the "upside down" bonding geometry used in the adhesive-free cold-weld process; the structure includes a 25% GaAs cell architecture. In this case, the GaAs cell thickness is reduced to 2 μm (50% of the conventional substrate-based cell) since the reflective, full-coverage ohmic contact allows for two passes of the incident light through the device active region. The primary focus will be on optimizing the tandem PV structure for maximum efficiency, including InGaP cell design (layer thickness, window layer, layer composition, etc.), improving the wide-gap tunnel junctions (TJ) between elements in the stack, and perfecting the multiple lift-off process over large areas for this multi-junction cell.

Solar cells will be grown with n-type material on top of p-type layers, whereas the tunnel junctions must be grown with the opposite polarity. The cells may employ carbon-doping in all or several of the p-type layers, since carbon does not readily migrate to the growth surface as does the conventional p-dopant, Be. As the tandem cells are generally limited by the current in the GaAs cell, the InGaP cell thickness needs to be adjusted to current-match the InGaP and GaAs cells; the thickness of the InGaP layer is expected to range from 0.55 to 0.80 μm.

Efficient tunnel junctions (TJ) are essential for high performance tandem cells. They need to be nearly loss-less in both voltage and absorption. It is advantageous to use an InGaP TJ in MJ cells to avoid GaAs TJ absorption that may be as high as 3%. A conventional TJ is an abrupt P+/N+ junction where the electron can tunnel directly from the conduction band on the n-type side to the valence band on the p-type side (FIG. 9($a$)). Little work has been performed on MBE grown wide gap TJs, although doping levels that are sufficiently high to transport currents generated at 1 sun illumination have been reported using MBE.

One embodiment is directed to InGaP tunnel junctions that have a voltage drop of several tens of mV at 1 sun. Research suggests that Be and Si are suitable dopants (attaining densities of $3.7\times10^{19}$ and $1.8\times10^{19}$ cm$^3$, respectively). However, if a reduced tunneling resistance is required, the use of engineered defects at the P+/N+ interface, can be done, such as by adding ErAs to a GaAs tunnel junction. In this case, ErP or LuP may be used as shown in FIG. 9$b$. The ErP or LuP form epitaxial islands on the semiconductor surface that are ~4 monolayers thick, are metallic, and split the tunneling process into two steps with significantly higher tunneling probabilities. By employing ErP in the TJ, several orders of magnitude increase in the tunneling current may result, and lead to voltage drops in the sub-mV range for the currents anticipated in the fabricated PV cells.

As in the case of the single junction cells, the multi-junction cell can be microscopically and chemically examined after each iteration of the growth-ELO-reuse cycle. Completed cells, including anti-reflection coating, can be electrically tested using standard illumination conditions (AM1.5G spectrum), but over a range of intensities up to 10 suns. Parameters to be measured include PCE, fill factor, open circuit voltage, short circuit current, series and parallel resistance, as in the case of the single junction cells.

Thin-film multi-junction cells bonded onto reflective and flexible substrates provide a unique opportunity to integrate the solar collector with the thin-film cell without introducing significant additional costs. FIG. 10 shows that a strip consisting of the ELO multi-junction cell is bonded to the center of a larger, flexible, reflective film. The film is then molded (by placement in a thermally conductive or actively cooled preform) into the shape of a compound parabolic collector (e.g. a CPC, or Winston collector). This geometry concentrates parallel solar rays onto the cell strip at its focus, as well as collects diffuse light within the acceptance cone.

The small levels of concentration (4-10×) generally used in the cylindrical Winston-type collectors allow the concentrators to be highly efficient, and to direct a significant amount to diffuse light into the cell. The efficiency of collection is given by CEff=$T_{CPC\gamma}$, where $T_{CPC}$ is the effective transmittance of the CPC, including losses of multiple bounces that are ~2% for common reflector materials. The correction for diffuse light is $\gamma=1-(1-1/C)Gdiff/Gdir$, where C is the intended concentration, and Gdiff/Gdir is the fraction of diffuse to total incident light. Typically, Gdiff/Gdir~0.11 for a low-cloudiness day. Then for C=4, $\gamma$=90% at AM1.5G, which is comparable to the power available at AM1.5D.

For a 4× CPC, and assuming a solar cell strip width of 1 cm, the aperture is then 4 cm wide×10 cm deep, providing a practical form factor compatible with panels used in single family dwellings. At higher concentrations, the size of the concentrator increases considerably. For example, a 10× concentration used with the same 1 cm wide cell strip requires an aperture of 10 cm with a depth of ~55 cm. This can be reduced to ~40 cm with negligible effect on concentration efficiency. [25] The amount of reflective material needed is 4-5 times larger for 4× concentration, and 8-11 times for 10× concentration.

Additional benefits to the small concentrations used include the allowed use of single-axis tracking (daily or seasonally, depending on orientation of the collector), and simplified passive cooling than are needed for higher concentrations. Indeed, the very thin substrates used greatly simplify heat transfer: calculations indicate that at 10× concentration and a 25 mm thick Kapton™ substrate placed against a passively cooled Cu heat sink results in a temperature rise of only 5-20° C., obviating the need for more aggressive cooling methods.

Note that the ELO cell technology can also be applied to systems with large concentration factors; however, here the present disclosure focused only on smaller concentrations that lead to simple and economical designs that are applicable to residential systems. The cost reductions in this integrated solar collector+ELO multi-junction concentrator cell assembly is expected to radically reduce the cost of concentrated systems, as well as their footprint (owing to the high PCE).

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Other embodiments of the invention will be apparent to those skilled in the art from consideration of the specification and practice of the invention disclosed herein. It is intended that the specification and examples be considered as exemplary only, with the true scope of the invention being indicated by the following claims.

What is claimed is:

1. A photovoltaic device comprising:
   a substrate comprising a reflective surface; and
   a solar cell comprising an active photovoltaic region and a metal contact;
   wherein the substrate is shaped as a cylindrical compound parabolic concentrator to concentrate incident light onto the active photovoltaic region of the solar cell, and
   wherein the metal contact of the solar cell is bonded directly to the reflective surface of the substrate, the solar cell being shaped as a strip, and the strip being disposed along a center of the cylindrical compound parabolic concentrator.

2. The photovoltaic device of claim 1, wherein the solar cell comprises a thin-film solar cell.

3. The photovoltaic device of claim 1, wherein the solar cell comprises a reflective ohmic contact such that the incident light has two passes through the active photovoltaic region.

4. The photovoltaic device of claim 3, wherein the reflective, ohmic contact is bonded to the reflective surface of the substrate.

5. The photovoltaic device of claim 1, wherein the substrate comprises a metal foil.

6. The photovoltaic device of claim 5, wherein the solar cell is bonded to the metal foil.

7. The photovoltaic device of claim 1, wherein the substrate comprises a metallized plastic foil.

8. The photovoltaic device of claim 7, wherein the solar cell is bonded to the metallized plastic foil.

9. The photovoltaic device of claim 1, wherein the cylindrical compound parabolic concentrator is configured to provide a concentration that falls in a range from 4 to 10.

10. The photovoltaic device of claim 1, wherein the solar cell comprises a multi-junction cell.

11. The photovoltaic device of claim 1, wherein the solar cell comprises a III-V semiconductor solar cell.

12. The photovoltaic device of claim 1, wherein the strip is attached to the center of the cylindrical compound parabolic concentrator.

13. The photovoltaic device of claim 1, wherein the solar cell comprises a thin-film solar cell.

14. The photovoltaic device of claim 1, wherein the metal contact is configured as a reflective ohmic contact such that the incident light has two passes through the active photovoltaic region.

15. The photovoltaic device of claim 1, wherein the substrate comprises a metal foil.

16. The photovoltaic device of claim 1, wherein the substrate comprises a metallized plastic foil.

17. The photovoltaic device of claim 1, wherein the compound parabolic concentrator is configured to provide a concentration that falls in a range from 4 to 10.

18. The photovoltaic device of claim 1, wherein the solar cell comprises a multi-junction cell.

19. The photovoltaic device of claim 1, wherein the strip is disposed within the cylindrical compound parabolic concentrator.

* * * * *